Dec. 3, 1968 K. SIWKO ET AL 3,414,820
DELAYED AGC SYSTEM UTILIZING THE PLATEAU REGION OF
AN AMPLIFIER TRANSISTOR
Filed Feb. 24, 1965 3 Sheets-Sheet 1

INVENTORS
KAROL SIWKO &
LUCIUS P. THOMAS
BY Eugene M. Whitacre
Attorney

INVENTORS
KAROL SIWKO &
LUCIUS P. THOMAS
BY Eugene M. Whitacre
Attorney

Fig. 3.
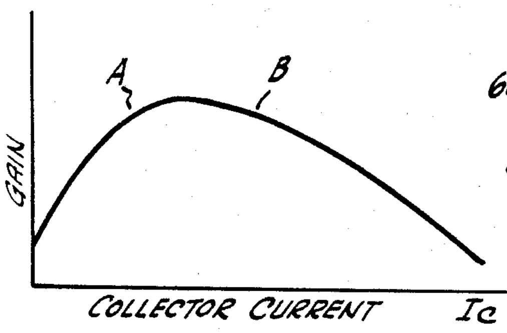
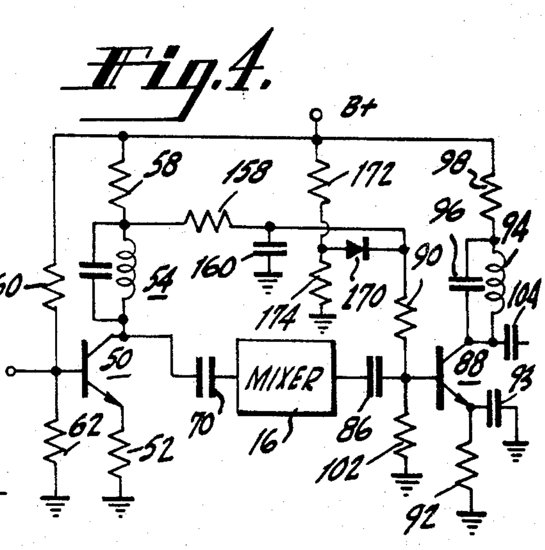
Fig. 5.
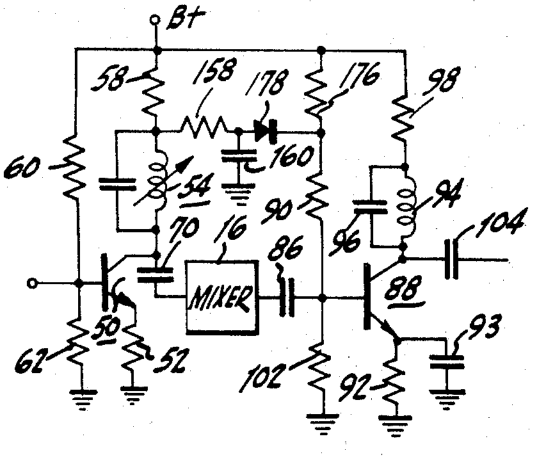
Fig 6
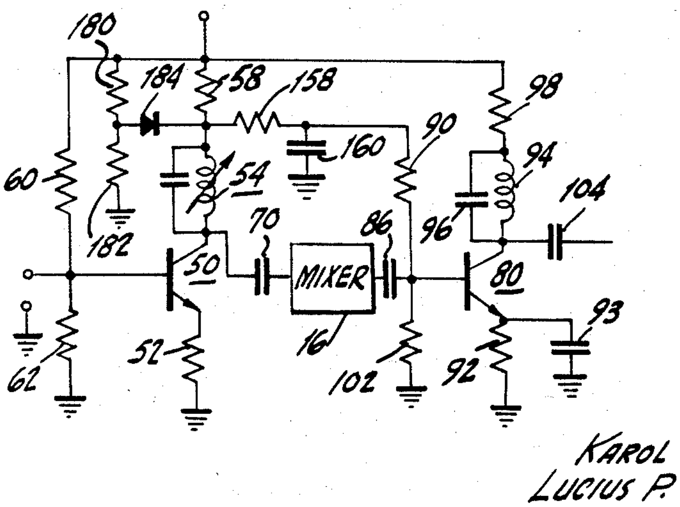
INVENTORS
KAROL SIWKO &
LUCIUS P. THOMAS
BY
Eugene M. Whitacre
Attorney

United States Patent Office 3,414,820
Patented Dec. 3, 1968

3,414,820
DELAYED AGC SYSTEM UTILIZING THE PLATEAU REGION OF AN AMPLIFIER TRANSISTOR

Karol Siwko and Lucius Ponder Thomas, Indianapolis, Ind., assignors to Radio Corporation of America, a corporation of Delaware
Filed Feb. 24, 1965, Ser. No. 434,873
16 Claims. (Cl. 325—410)

ABSTRACT OF THE DISCLOSURE

A delayed action AGC system wherein the gain of the RF stage is delayed with respect to the IF stage. The derived control voltage is fed back to the base of an RF amplifier transistor so that a variation in the control voltage causes a similar variation in the transistor collector current. A second amplified control voltage is derived from the collector of the RF transistor and is used to control the gain of subsequent IF stages. The delay is caused by the operation of the RF transistor in its plateau region wherein its gain remains constant for increases in collector current up to a certain point, after which its gain decreases.

This invention relates to automatic gain control circuits and more particularly to such circuits for controlling the gain of semiconductor amplifiers.

The object of an automatic gain control system is to control the gain of a signal translating system such as a radio receiver as an inverse function of received signal strength so that the signal output level of the receiver remains substantially constant for a large range of applied signal strengths. The efficiency of an automatic gain control system is determined by the degree of change in the receiver signal output for a wide range of changes in the input signal strengths and is directly related to the gain of the automatic gain control loop. The higher the loop gain, the more constant the output of the receiver remains with changes in signal strength.

Generally the gain of radio frequency amplifiers and intermediate frequency amplifier stages are controlled to compensate for fluctuations in received signal strength. In order to maintain the signal-to-noise ratio of the receiver at low signal levels, it is desirable to create a delayed automatic gain control type of action on the radio frequency amplifier stage (so that the stage operates at full gain for the low signal levels) while compensating for the changes in signal strength by adjusting the gain of the intermediate frequency stages. At higher signal levels, the gain of the radio frequency amplifier stage can be decreased without a noticeable effect on the signal-to-noise ratio.

Where a plurality of cascaded transistor amplifier stages, such as intermediate frequency amplifiers, are cojointly controlled from a common automatic gain control voltage source, it was often found that the gain of the different stages did not change equally. This was caused by the non-uniformity found in transistor characteristics. Excessive gain reduction of one stage may result in distortion.

It is an object of this invention to provide an improved automatic gain control system.

It is also an object of this invention to provide an improved automatic gain control system for radio signal receivers that includes a delayed automatic gain control type of action on a radio frequency amplifier stage.

It is still a further object of this invention to provide an improved automatic gain control system for radio signal receivers where a plurality of cascaded transistor stages are cojointly controlled from a common automatic gain control source to provide controllable, such as equal, gain changes in each of the plurality of transistor stages.

The invention provides an improved delayed automatic gain control system for radio signal receivers of the type including a transistor signal translating stage, such as a radio frequency amplifier or mixer stage having an input circuit coupled to a source of received radio signals. The signal translating stage exhibits a gain versus transistor collector current characteristics that is substantially constant for a range of transistor collector currents and decreases as the collector current changes in a direction away from said range of collector currents. The transistor is biased for collector currents toward one end of said range of collector currents. An automatic gain control voltage is developed and is coupled to the signal translating stage to control the gain thereof. For a range of low level signals the automatic gain control voltage varies the collector current of the transistor through the relatively constant gain portion of the gain versus transistor collector current characteristic. For higher level radio signals the transistor collector current changes to values such that the gain of the signal translating stage is changed. This action provides a delayed automatic gain control so that maximum signal translating stage gain is available for weak signals.

A further feature of the invention includes circuit means for developing an amplified automatic gain control voltage in the signal translating stage which may be used to control subsequent signal amplifier stages such as intermediate frequency amplifiers. Thus, although the gain of the signal translating stage may not change significantly with changes in the strength of small signals, the collector current of the signal translating stage transistor changes and is used to develop a corresponding automatic gain control voltage which is applied to control the gain of the signal amplifier stage so that the signal output level from the receiver remains substantially constant.

In accordance with a further feature of the invention, a clamping circuit is connected to become operative at very high signal levels wherein the signal amplifier stage gain remains substantially constant while the signal translating stage gain changes.

It is also a feature of this invention to bias a plurality of controlled transistor signal amplifier stages by voltage source so that the changes in gain in the signal amplifier stages for a given change in signal strength can be substantially equalized.

It is still a further feature of this invention to feed back at least a portion of the amplified automatic gain control voltage to the automatic gain control voltage developing circuit to increase the efficiency of the automatic gain control system.

The automatic gain control system of the invention will be described in the context of a television receiver. It is to be understood, however, that the fundamental concepts to be described are more generally applicable. For example, the system may be used in broadcast or communication receivers.

The novel features that are considered characteristic of this invention are set forth with particularity in the appended claims. The invention itself, however, both as to its organization and method of operation as well as additional objects and advantages thereof, will best be understood from the following description when read in connection with the accompanying drawings.

In the drawings:

FIGURE 3 is a typical gain versus transistor collector current characteristic of a transistor radio frequency, or intermediate frequency amplifier;

FIGURE 4 is a modification of a portion of the circuit of FIGURE 2;

FIGURE 5 is a second modification of a portion of the circuit of FIGURE 2; and

FIGURE 6 is a third modification of a portion of the circuit of FIGURE 2.

Figure 1:
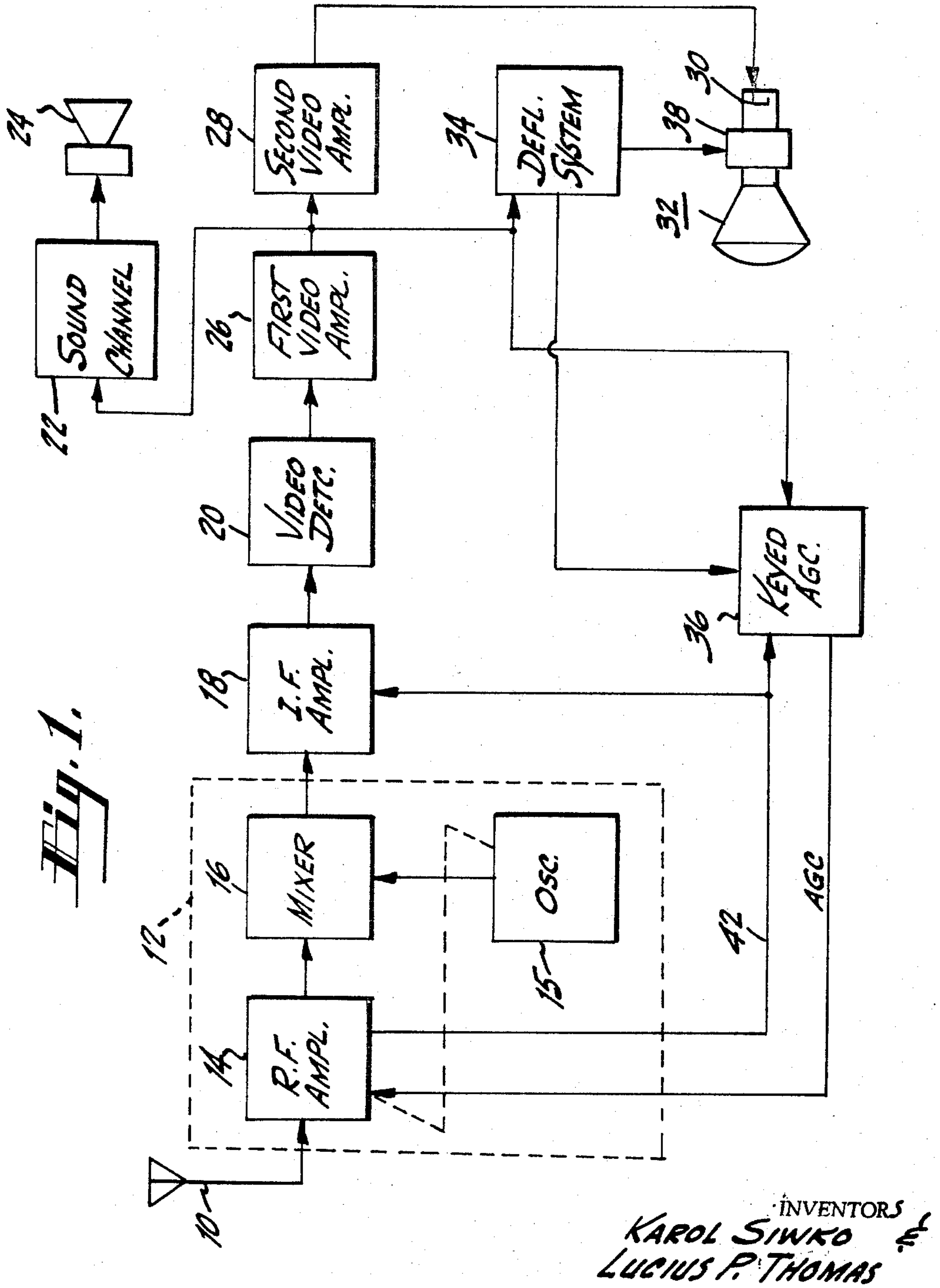
FIGURE 1 is a block diagram of a television receiver embodying the automatic gain control system of the invention.

A block diagram of a television receiver is shown in FIGURE 1 and will be considered before taking up a detailed description of the automatic gain control (AGC) system of the present invention. The television receiver includes an antenna 10 for receiving and applying television signals to a tuner apparatus 12 (shown enclosed in a dashed block) which includes a radio frequency amplifier 14, an oscillator 15 and a frequency converter or mixer 16, the latter to convert the amplified radio frequency signal frequencies to a fixed intermediate frequency. The intermediate frequency output signals of tuner 12 are applied to an intermediate frequency amplifier 18 which may include one or more stages of amplification for increasing the amplitude of the intermediate frequency signal to a suitable value for detection by a video detector 20. The detected modulation components at the output circuit of the detector 20 include the composite video and synchronizing signals plus the 4.5 mc. intercarrier sound signal.

The detected output signal is amplified by a first video amplifier 26, the output circuit of which is coupled to a sound channel 22, a second video amplifier 28, a deflection system 34 and a keyed automatic gain control circuit 36. The modulated sound carrier is separated from the composite video signal and detected in the sound channel 22 and reproduced by a speaker 24. The second video amplifier 28 amplifies the video signals and applies them to a cathode 30 of a picture tube 32. The deflection system 34 is of known construction and separates the synchronizing components from the picture portion of the composite signal. These synchronizing components are then used to synchronize the horizontal and vertical deflection generators which drive the deflection yoke 38.

The output signals from the first video amplifier 26 and the deflection system 34 are applied to the keyed automatic gain control circuit 36, which in turn produces direct current (D-C) automatic gain control voltage. The automatic gain control voltage is applied to the radio frequency amplifier stage 14 to control the gain thereof.

In the present embodiment of the invention, the radio frequency amplifier 14 amplifies the automatic gain control voltage and applies the amplified automatic gain control voltage (line 42) to the intermediate frequency amplifier stage 18 to control the gain thereof. The amplified automatic gain control voltage is also applied as regenerative feedback to the keyed automatic gain control circuit 36 to increase the loop gain of the automatic gain control system.

Figure 2:
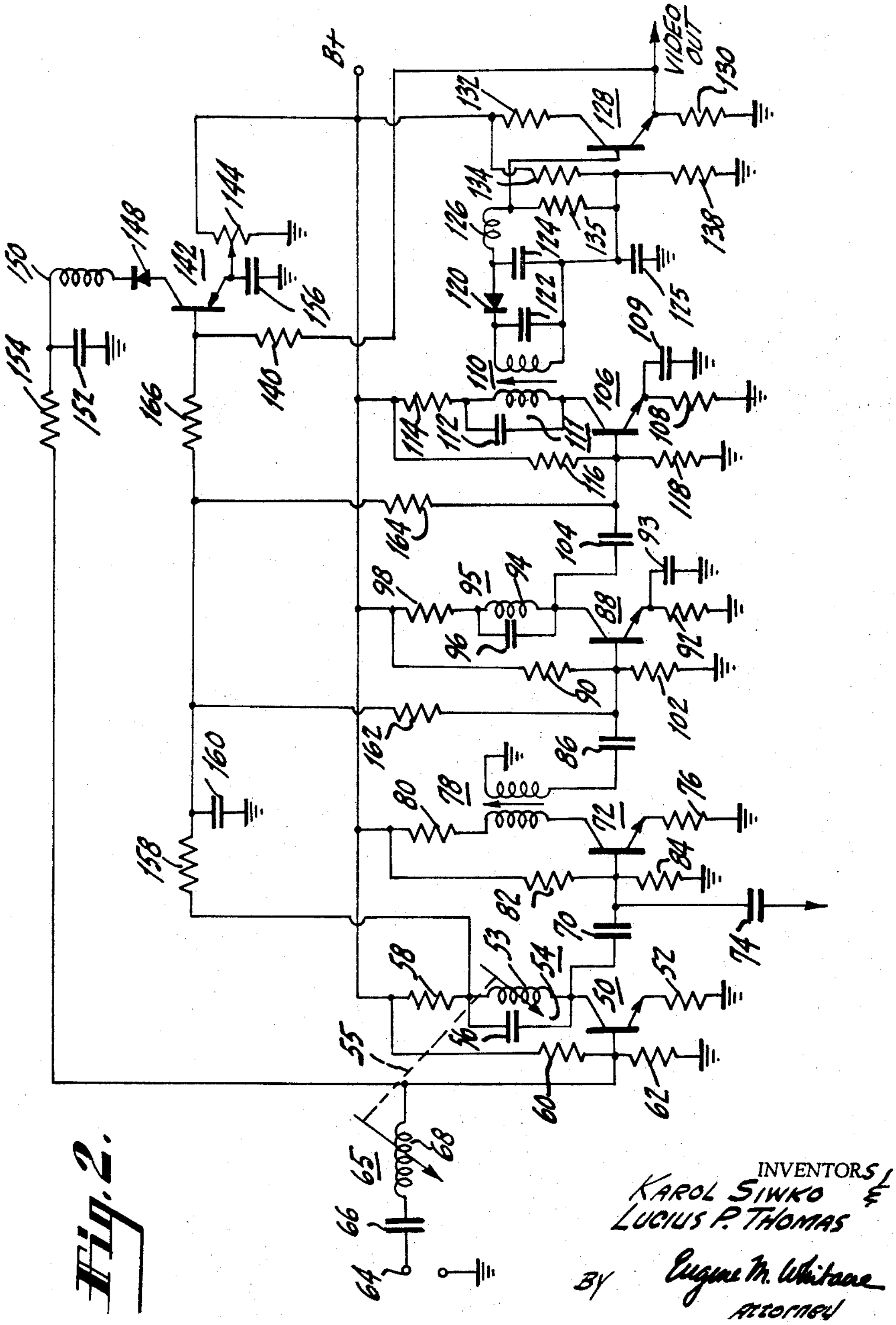
FIGURE 2 is a circuit diagram of a portion of a television receiver of FIGURE 1.

As illustrated in FIGURE 2, the radio frequency amplifier includes a transistor 50 having its emitter connected to ground through a resistor 52 and its collector connected to a source of energizing potential (a terminal designated by the symbol B+) through a series resistor 58 and a parallel resonant circuit 54, including a variable inductor 53 and a capacitor 56. The transistor 50 is biased into conduction by a voltage developed at the junction of resistors 60 and 62 connected between the B+ terminal and ground. Input signals to be amplified are applied between a terminal 64 and ground and are coupled to the base of the transistor 50 through a series resonant circuit 65 including a capacitor 66 and a variable inductor 68. The variable inductors 53 and 68 are mechanically linked (dashed line 55) for selectively tuning the radio frequency amplifier to a desired frequency or television channel.

The amplified radio frequency signals developed across the circuit 54 are coupled through a capacitor 70 to a conventional mixer or converter stage including a transistor 72. The radio frequency signals are heterodyned with the output wave of an oscillator (not shown) applied through a capacitor 74, to produce a corresponding intermediate frequency signal. The emitter of the transistor 72 is connected to ground through a resistor 76 while the collector is connected through a primary winding of a tuned transformer 78 and a series resistor 80 to the B+ terminal. The transistor 72 is biased into conduction by a voltage developed at the junction of resistors 82 and 84 connected between the B+ terminal and ground.

The resultant intermediate frequency signal is coupled from a secondary winding of the transformer 78, through a capacitor 86, to a first intermediate frequency amplifier which includes a transistor 88. The emitter of the transistor 88 is connected to ground through a parallel biasing combination including a bypass capacitor 93 and resistor 92, while the collector is connected to the B+ terminal through a series resistor 98 and a parallel tuned circuit 95, including an inductor 94 and a capacitor 96. The transistor 88 is biased into conduction by a voltage developed at the junction of a pair of series resistors 90 and 102 connected between the B+ terminal and ground.

The amplified intermediate frequency signal is coupled through a capacitor 104 to a second intermediate frequency amplifier stage which includes a transistor 106. The emitter of the transistor 106 is connected to ground through a parallel biasing combination of a resistor 108 and a bypass capacitor 109 while the collector is connected to the B+ terminal through a series resistor 114 and a parallel tuned circuit 111 including a primary winding of transformer 110 and a capacitor 112. The second intermediate frequency stage is biased into conduction by a voltage developed at the junction of a pair of series resistors 116 and 118 connected between the B+ terminal and ground.

The amplified intermediate frequency signal developed across the secondary winding of the transformer 110 and a capacitor 122, is detected by a video detector diode 120. The intermediate frequency signal is filtered by the capacitors 124 and 125 and a series inductor 126, to produce a composite signal including the picture and synchronizing pulses plus the intercarrier sound signal. The composite signal is coupled to a first video amplifier including a transistor 128 which in the present embodiment, is connected as an emitter follower. The emitter of transistor 128 is connected to ground through a resistor 130 while the collector is connected to the B+ terminal through a resistor 132. The transistor 128 is biased into conduction by a voltage developed at the junction of the series resistors 134, and 138 connected between the B+ terminal and ground through a biasing resistor 135.

The composite video signal is coupled through a resistor 140 to the base of a keyed automatic gain control circuit transistor 142. Flyback pulses are derived during the horizontal blanking interval by a secondary winding 150 which is coupled to the output transformer of the deflection system (not shown) and are applied to the collector of the transistor 142 through a diode 148. Biasing means such as an emitter potentiometer 144, connected between the B+ terminal and ground, is provided to maintain transistor 142 nonconductive except during reception of both a horizontal synchronizing pulse and the flyback pulse. A by-pass capacitor 156 is connected between the emitter of transistor 142 and ground. The output signal from the keyed automatic gain control circuit is applied to a filter circuit including a shunt capacitor 152 and a series resistor 154 having a time constant that is long enough to hold a charge on the capacitor 152 over several horizontal lines and short enough to permit the automatic gain control output to follow and compensate for rather rapid fluctuation in signal strength. The diode 148 is connected between the secondary winding 150 and the collector of transistor 146 to prevent the forward biasing of the collector-to-base junction of the transistor 142 by the voltage developed across capacitor 152 during the period when the flyback pulses are not present.

The output voltage from the keyed automatic gain control filter circuit is applied to the base electrode of the radio frequency transistor 50 to vary the bias on the transistor, in the present embodiment, in the forward direction, i.e., so that the current through the transistor 50 increases as the received signal strength increases. With the presently available commercial transistors, forward automatic gain control biasing is used since this method is less susceptible to cross-modulation distortion.

The changes in the biasing current observed at the base of transistor 50 due to changes in the automatic gain control voltage are amplified and a voltage that is proportional to the biasing current changes is developed across the resistor 58. In the present embodiment the size of the resistor 58 was selected to produce an amplification of the automatic gain control voltage. The amplified automatic gain control voltage is coupled through a filter network including a series resistor 158 and a shunt capacitor 160 and through an isolation resistor 162, to the base of the first intermediate frequency transistor 88. Because of the phase inversion in the action of the transistor 50, the voltage coupled to the base of the transistor 88 causes the current in transistor 88 to decrease with increases in signal strength. The amplified voltage is also applied to the base of the intermediate frequency transistor 106 in a similar manner as applied to the first intermediate frequency amplifier as shown by the resistor 164.

In order to provide equal gain changes in the controlled intermediate frequency amplifiers (transistors 88 and 106) for given change in the amplified automatic gain control voltage to prevent excessive gain changes one stage, the values of the various components in the biasing network for the stages are selected to provide a voltage source type of biasing circuit. The resistance value of resistors 102 and 118, in the present embodiment are in the order of 560 ohms, very low compared to the input impedance of the respective transistors. With a voltage source type of biasing network, the quiescent collector currents of the transistors 88 and 106 are substantially independent of the current amplification factor of the individual transistors, and are primarily dependent upon the voltage developed at the base of the transistors and the resistance value of the emitter resistors 92 and 108.

Furthermore, when driving a plurality of stages from a common automatic gain control source, it is necessary to provide a means of isolating the stages to minimize any interaction. In the present embodiment the resistors 162 and 164 provide the required isolation and have values in the order of 10K ohms.

The two series circuits including a high resistance isolation resistor (resistors 162 and 164) and a low resistance biasing resistor (resistors 102 and 118) form two voltage divider networks wherein only a small portion of the voltage applied to the resistors 162 and 164 is developed across the biasing resistors 102 and 118. As a result, the control voltage source required to drive these intermediate amplifier stages over the required range of gain changes must be capable of developing a greater range of voltages than that generally developed by the usual type of automatic gain control circuit. In the circuit of the invention the radio frequency amplifier stage transistor 50 serves a dual function by amplifying the radio frequency signals and also amplifying the automatic gain control voltage applied to its base thereby providing a source of control voltage of sufficient amplitude to drive the intermediate frequency transistors over the required range of gain changes.

In addition to controlling the bias of the intermediate frequency transistors, the amplified automatic gain control voltage developed across the resistor 58 is applied as a positive D-C feedback voltage to the base of the keyed automatic gain control transistor 142 through a resistor 166.

As an alternative to the biasing arrangement previously mentioned, the polarity of the output of the keyed automatic gain control circuit can be reversed to produce an output that decreases the forward bias on the radio frequency amplifier with a decreased signal strength. In such a case, the gain on the intermediate frequency stages is controlled by increasing the forward bias on the intermediate frequency transistors with increased signal level. If, on the other hand, reverse bias control is preferred on both the intermediate frequency and radio frequency stages (decreasing the bias voltage with increased signal) the circuit of FIGURE 2 can be modified by coupling the base of the intermediate frequency amplifier to the emitter resistor 52. This will produce a voltage that will tend to reduce the intermediate frequency transistor current as the radio frequency transistor current decreases with increased signal strength.

FIGURE 3 is an illustration of a typical gain versus transistor collector current characteristic of a transistor radio frequency or intermediate frequency amplifier. A combination of changes in the input and output impedances and the transconductance of the transistor employed in these circuits produces a gain characteristic wherein the gain of the stage is substantially constant for a range of transistor collector currents (between points A and B) and decreases when the collector currents change in a direction away from the range of collector current (to the left of point A and to the right of point B as viewed in FIGURE 3).

A delayed automatic gain control action on the radio frequency amplifier is obtained by proportioning the biasing networks of the radio frequency transistor and the intermediate frequency transistors of FIGURE 2 for a collector current corresponding to the point A on the curve of FIGURE 3. As previously mentioned, the automatic gain control action on the radio frequency transistor 50 produces an increase in collector current for an increase in received signal strength. Under these biasing conditions it should be noted that an increase in the transistor 50 collector current from point A to point B (FIGURE 3) causes very little change in the radio frequency amplifier gain, thereby holding the gain of the stage substantially constant over the given range of received low level signals. It should also be noted that although the gain of the radio frequency amplifier does not change for these low level signals, the direct current through the transistor 50 increases with increasing signal strength and that the collector current of the controlled intermediate frequency transistors 88 and 106 correspondingly decreases (a greater voltage drop is developed across the resistor 58 thereby reducing the biasing voltage at the base of the transistors 88 and 106). Since transistors 88 and 106 are also biased at point A, this decrease in the collector current of the transistors 88 and 106, decreases intermediate frequency gain while the radio frequency gain remains substantially constant. This provides a delayed automatic gain control action on radio frequency stage while compensating for changes in signals strength in the intermediate frequency stages. After the signal strength has reached a predetermined level wherein transistor 50 collector current exceeds that of point B, gain reduction will occur in both the intermediate frequency and radio frequencies amplifier stages.

If the reduction in gain in the intermediate frequency stages is excessive, the range of the automatic gain control action on the intermediate frequency stages may be reduced through the use of various clamping circuits illustrated in FIGURES 4, 5 and 6. The same reference numerals as used in FIGURES 1 and 2 will apply to the same components in FIGURES 4–6.

The bias voltage swing at the base of the transistor 88, is limited in the modification of FIGURE 4 by connecting the resistor 90 to the capacitor 160 rather than the B+ terminal as illustrated in FIGURE 2. A diode 170 is connected between the junction of the capacitor 160 and the resistor 90, and a voltage divider including resistors 172 and 174 connected between the B+ terminal and ground. When the cathode voltage on the diode 170 becomes more negative than the anode voltage due to a given increase signal strength, the diode 170 will conduct. The resistance of resistors 172 and 174 is low compared to the resistance of resistor 58 thereby providing a clamping action of the transistor 88 base bias voltage when diode 170 conducts, limiting any further change in the bias of the transistor 88.

In the modified circuit of FIGURE 5, one end of resistor 90 is connected to the B+ terminal through an additional resistor 176. The voltage developed at capacitor 160 is coupled to the junction of the resistors 176 and 90 through a diode 178. The diode 178 is biased so that when the voltage drop across resistor 58 increases beyond a certain limit, the anode of diode 178 becomes less positive than the voltage at junction of resistors 176 and 90 and the diode 178 ceases to conduct thereby limiting any further change in the bias of the transistor 88.

FIGURE 6 is an illustration of a third modification of FIGURE 2. A voltage divider including series resistors 180 and 182 is connected between the B+ terminal and ground. The resistance of resistors 180 and 182 is low compared to that of the resistor 58. A diode 184 is connected between the junction of the two resistors 180 and 182 and the junction of resistor 58 with the RF tuned circuit 54. This circuit limits the amplitude of voltage change developed across resistor 58. The diode 184 conducts when the voltage drop across resistor 58 reaches a preset threshold level wherein the voltage drop across resistor 182 is less than that of the voltage developed at the junction of resistor 58 and the tuned circuit 54.

As previously mentioned, the amplified automatic gain control voltage developed across the resistor 58, is coupled to the base of the keyed automatic gain control transistor 142. The radio frequency amplifier transistor inverts the phase or direction of the automatic gain control voltage so that the amplified gain control voltage is coupled to the automatic gain control transistor 142 as positive feedback. This positive feedback increases the loop gain of the automatic gain control system thereby providing for higher efficiency of operation, i.e., the output of the receiver remains more constant over a range of changes in signal strength than without the feedback.

What is claimed is:

1. An automatic gain control system for radio frequency signal receivers comprising:

an automatic gain control circuit for developing a voltage that is a function of the strength of the received signal;

a transistor having base, emitter and collector electrodes;

circuit means connecting said base, emitter and collector electrodes to form a radio frequency amplifier stage having a collector-to-emitter current path and having an input circuit coupled to a source of received signals;

first direct current means for applying said output of the automatic gain control circuit to said radio frequency amplifier transistor to control the collector-to-emitter current thereof;

an intermediate frequency amplifier stage including a transistor;

a second direct current means coupling the collector-to-emitter current path on said radio frequency amplifier transistor to said intermediate frequency amplifier to control the current thereof as a function of the radio frequency transistor emitter-to-collector current, and biasing means for said radio frequency amplifier transistor and said intermediate amplifier transistor, said biasing means being so proportioned that for a given range of low level received signals the gain of the intermediate frequency amplifier stage is changed while the gain of the radio frequency amplifier stage remains substantially constant, and for a range of higher level received signals both the radio frequency amplifier stage gain and the intermediate frequency amplifier stage gain is changed.

2. An automatic gain control system for radio frequency signal receivers comprising:

a semiconductor device having first, second and control electrodes;

circuit means connecting said first, second and control electrodes to form a radio frequency amplifier having a first-to-second electrode current path and having an input circuit coupled to a source of received signals;

means for developing an automatic gain control voltage;

first direct current means for applying said automatic gain control voltage to said radio frequency amplifier semiconductor device to control the first-to-second electrode current thereof;

means for developing a voltage proportional to the first-to-second electrode current of said radio frequency amplifier semiconductor device;

an intermediate frequency amplifier including a semiconductor device;

second direct current means for applying said developed voltage to said intermediate frequency amplifier stage to control the gain thereof;

biasing means for said radio frequency amplifier semiconductor device and said intermediate amplifier semiconductor device, said biasing means being so proportioned that for a given range of low level radio frequency signals the gain of the intermediate frequency amplifier stage is changed while the gain of the radio frequency amplifier stage remains substantially constant, and for a range of higher level radio frequency signals both the radio frequency amplifier stage gain and the intermediate amplifier stage gain is changed.

3. An automatic gain control system for radio frequency signal receivers comprising:

means for developing an automatic gain control voltage;

a transistor having base, emitter and collector electrodes;

circuit means connecting said base, emitter and collector electrodes to form a radio frequency amplifier stage having a collector-to-emitter current path and having an input circuit coupled to a source of received signals;

a first direct current means for applying said automatic gain control voltage to said radio frequency amplifier stage to control the collector-to-emitter current of said radio frequency amplifier transistor;

means coupled to the collector-to-emitter current path of said radio frequency amplifier transistor for developing a second automatic gain control voltage;

a plurality of intermediate frequency amplifier stages, each stage including a transistor;

second direct current means for applying the output of said means coupled to said collector-to-emitter current path to at least one intermediate frequency amplifier stage to control the gain thereof as a function of said second automatic gain control voltage; and biasing means for said radio frequency amplifier transistor and said intermediate amplifier transistor, said biasing means being so proportioned that for a given range of low level received signals the gain of the intermediate frequency amplifier stage is changed while the gain of the radio frequency amplifier stage remains substantially constant, and for a range of higher level signals both the radio frequency amplifier stage gain and the intermediate amplifier stage gain is changed.

4. An automatic gain control system for radio frequency signal receivers comprising:

a transistor having base, emitter and collector electrodes;

circuit means connecting said base, emitter and collector electrodes to form a radio frequency amplifier stage having a collector-to-emitter current path and having an input circuit coupled to a source of received signals;

means for developing an automatic gain control voltage;

a first direct current means for coupling said automatic gain control voltage to a said radio frequency amplifier stage to control the collector-to-emitter current thereof;

means coupled to the collector-to-emitter current path of said radio frequency amplifier transistor for developing an amplified automatic gain control voltage;

an intermediate frequency amplifier stage including a transistor;

high resistance coupling means for applying the amplified automatic gain control voltage to said intermediate frequency amplifier transistor;

low resistance biasing means connected to said intermediate frequency amplifier transistor to provide a voltage source for biasing said intermediate frequency amplifier transistor;

biasing means for said radio frequency amplifier transistor; and said high resistance coupling means, said low resistance biasing means and said biasing means for said radio frequency amplifier transistor being so proportioned that for a given range of low level radio frequency signals the gain of the intermediate frequency amplifier stage is changed while the gain in the radio frequency amplifier stage remains substantially constant, and for a range of higher level signals both the radio frequency amplifier stage gain and the intermediate frequency amplifier stage gain is changed.

5. An automatic gain cotnrol system for radio frequency signal receivers comprising:

an automatic gain control circuit for developing a voltage that is a function of the strength of the received radio frequency signal;

a transistor having base, emitter and collector electrodes;

circuit means connecting said base, emitter and collector electrodes to form a radio frequency amplifier stage including an input circuit, said radio frequency amplifier stage exhibiting a gain versus transistor collector current characteristic that has a first portion wherein the gain is substantially constant for a first range of collector current and a second portion wherein the gain decreases for collector current greater than said first range;

means for biasing said radio frequency transistor toward the low end of said first range of collector currents;

means for applying the output voltage of said automatic gain control circuit to said radio frequency amplifier transistor to control the collector-to-emitter current thereof;

means coupled to the collector-to-emitter current path of said radio frequency amplifier transistor for developing an amplified automatic gain control voltage;

an intermediate frequency amplifier stage including a transistor;

a second direct current means for applying said amplified automatic gain control voltage to the intermediate frequency amplifier stage to control the gain thereof;

biasing means for said intermediate frequency amplifier; and said second direct current means, said biasing means for said intermediate frequency amplifier and said biasing means for said radio frequency amplifier being so proportioned that for a first range low level received signals the gain of the intermediate frequency amplifier stage is changed while the radio frequency amplifier stage remains substantially constant and for second range of higher level radio frequency signals the gain of both the radio frequency amplifier stage and the intermediate frequency amplifier stage is changed.

6. An automatic gain control system for maintaining the output of a radio frequency receiver substantially constant for a range of variation in received signal strength comprising:

a first and second transistors having base, emitter and collector electrodes;

circuit means connecting said first transistor base, emitter and collector electrodes to form a signal translating stage having a collector-to-emitter current path and including an input circuit coupled to a source of received signals;

circuit means connecting to said second transistor base, emitter and collector electrodes to form a signal amplifier stage having a collector-to-emitter current path;

said signal amplifier and signal translating stages having a gain versus transistor collector current characteristic wherein the stage gain is substantially constant for a range of collector currents, and wherein the stage gain decreases as the collector current varies in a direction away from said range of collector currents;

means for biasing said first transistor in said range of collector currents;

means for biasing said second stage transistor at a point on said gain versus transistor collector current characteristics wherein a change in collector current in one direction away from said range of collector currents reduces the gain of said signal amplifier stage;

means for producing an automatic gain control voltage that changes as a function of the strength of the received signal;

circuit means coupling said collector-to-emitter current voltage to the biasing means of said first transistor to control the collector-to-emitter current thereof, and circuit means coupling said collector-to-emitter current path of said first transistor to the biasing means of said second transistor to control the collector-to-emitter current thereof, said circuit means having a polarity to vary the collector-to-emitter current of said second transistor in a manner to change the collector current in said one direction wherein the gain of said signal amplifier stage varies inversely with received signal strength.

7. An automatic gain control system for maintaining the output of a radio frequency receiver substantially constant for a range of variations in received signal strength comprising:

a first and second transistors having base, emitter and collector electrodes;

circuit means connecting said first transistor base, emitter and collector electrodes to form a signal translating stage having a collector-to-emitter current path and including an input circuit coupled to a source of received signals;

circuit means connecting said second transistor base emitter and collector electrodes to form a signal amplifier stage having a collector-to-emitter current path;

said signal translating stage having a gain versus transistor collector current characteristic wherein the gain of said stage is substantially constant for a range of collector currents, and wherein the gain of said stage decreases as the collector current changes in a direction away from said range of collector currents;

means for biasing said first transistor in said range of collector currents;

biasing means for biasing said second transistor;

means for producing an automatic gain control voltage;

circuit means coupling said means for producing said automatic gain control voltage to the biasing means of said first transistor to control the collector-to-emitter current thereof, and circuit means coupling said collector-to-emitter current of said first transistor to the biasing means of said second transistor to control the collector-to-emitter current thereof, said circuit means having a polarity to vary the collector-to-emitter current of said second transistor in a manner to change the gain of said stage inversely with signal strength.

8. An automatic gain control system for maintaining the output of a radio frequency receiver substantially constant for a range of variations in received signal strength comprising:

a first and second transistors having base, emitter and collector electrodes;

circuit means connecting said first transistor base, emitter and collector electrode to form a signal translating stage having a collector-to-emitter current path and including an input circuit coupled to a source of received signals, said signal translating stage having a gain versus transistor collector current characteristic wherein the gain of said stage is substantially constant for a range of collector currents, and wherein the gain of said stage decreases as the collector current changes in a direction away from said range of collector currents;

biasing means for biasing said first transistor in said range of collector currents;

circuit means connecting said second transistor base, emitter and collector electrodes to form a signal amplifier stage having a collector-to-emitter current path;

biasing means for biasing said second transistor;

means for producing a first automatic gain control voltage that is a function of the strength of the received signal;

circuit means coupling said means for producing said first automatic gain control voltage to said biasing means of said first transistor to control the collector-to-emitter current thereof so that for a first range of low level signals said first transistor collector current is varied in the constant gain portion of said characteristic and for a second range of signal having a higher level than said first range of low level signals said first transistor current is changed beyond the constant gain portion of said characteristics and the gain of the signal translating stage reduced;

means coupled to the collector-to-emitter current path of said first transistor for developing a second automatic gain control voltage that is a function of said first transistor collector-to-emitter current;

circuit means for applying said second automatic gain control voltage to said biasing means of said second transistor to control the collector-to-emitter current thereof, said second automatic gain control voltage having a polarity to vary the collector-to-emitter current of said second transistor in a manner to change the gain of said stage as an inverse function of received signal strength; and clamping means, coupled to said means for applying said second automatic gain control voltage to said second transistor, for limiting the magnitude of said second automatic gain control voltage applied to said second transistor so that for a third range of received signals having a level higher than said second level, the gain of the signal translating stage is changed while the gain of the signal amplifier stage remains substantially constant.

9. An automatic gain control system for maintaining the output of a radio frequency receiver substantially constant for a range of variations in signal strength comprising:

a first and second transistors having base, emitter and collector electrodes;

circuit means connecting said first transistor base, emitter and collector electrodes to form a signal translating stage having a collector-to-emitter current path and including an input circuit coupled to a source of received signals;

circuit means connecting said second transistor base, emitter and collector electrodes to form a signal amplifier stage having a collector-to-emitter current path;

said signal translating stage having a gain versus transistor collector current characteristic wherein the gain of said stage is substantially constant for a range of collector currents, and wherein the gain of said stage decreases as the collector current changes in a direction away from said range of collector currents;

means for biasing said first transistor in said range of collector currents;

biasing means for biasing said second transistor;

means for producing an automatic gain control voltage;

circuit means coupling said means for producing said automatic gain control voltage to said first transistor to control the collector-to-emitter current thereof;

circuit means coupling the collector-to-emitter current of said first transistor to said second transistor to control the collector-to-emitter current thereof to change the gain of said signal amplifier stage as an inverse function of the received signal strength; and positive feedback means coupling the collector-to-emitter current path of said first transistor to said means for developing an automatic gain control voltage.

10. An automatic gain control system for a television receiver comprising:

a keyed automatic gain control circuit, including a transistor, for developing an automatic gain control voltage that is a function of the strength of the received signals;

a transistor having base, emitter and collector electrodes;

circuit means connecting said base, emitter and collector electrodes to form a radio frequency amplifier stage having a collector-to-emitter current path and including an input circuit coupled to a source of received signals;

first direct current means coupling the automatic gain control voltage to said radio frequency amplifier stage to control the current in said collector-to-emitter current path;

an intermediate frequency amplifier including a transistor;

second direct current means coupling the collector-to-emitter current path of said radio frequency amplifier transistor to said intermediate frequency amplifier to control the gain thereof as a function of the radio frequency amplifier transistor emitter-to-collector current; and third direct current means coupling said collector-to-emitter current path one of said radio frequency amplifier and intermediate frequency amplifier to said keyed automatic gain control transistor to improve the efficiency of said keyed automatic gain control circuit.

11. An automatic gain control system for television receivers comprising:

a keyed automatic gain control circuit including a transistor, said circuit developing a voltage that is a function of the strength of the received signal;

a transistor having base, emitter and collector electrodes;

circuit means connecting said base, emitter and collector electrodes to form a radio frequency amplifier stage having a collector-to-emitter current path;

first direct current means coupling the output voltage of said keyed automatic gain control circuit to said radio frequency amplifier stage transistor to control said collector-to-emitter current thereof;

an intermediate frequency amplifier stage including a transistor;

second direct current means coupling the collector-to-emitter current path of said radio frequency amplifier transistor to said transistor intermediate frequency amplifier transistor to control the gain thereof as a function of the radio frequency transistor collector-to-emitter current;

biasing means for said radio frequency amplifier stage transistor and said intermediate amplifier stage transistor, said biasing means being so proportioned that for a given range of low level of received television signals the gain of the intermediate frequency amplifier stage is changed while the gain of the radio frequency amplifier remains substantially constant, and for a range of higher level of received television signals both the radio frequency amplifier stage gain and intermediate frequency amplifier stage gain is changed, and positive feedback means coupling said radio frequency amplifier stage transistor collector-to-emitter current path to said keyed automatic gain control transistor to increase the gain of said keyed automatic gain control circuit.

12. In a television receiver of the type including, a transistor radio frequency amplifier having a collector-to-emitter current path, a plurality of transistor intermediate frequency amplifiers, and a transistor automatic gain control circuit controlling the bias on the transistor radio frequency amplifier, the improvement comprising:

impedance means connected in series with said collector-to-emitter current path of said radio frequency amplifier transistor to develop a voltage that is proportional to the collector-to-emitter current;

means for applying the voltage developed across said impedance means to at least one intermediate frequency amplifier transistor for controlling the bias thereof, and means for regeneratively applying the voltage developed across said impedance means to said automatic gain control circuit transistor.

13. In a television receiver including a transistor having its base, emitter, and collector electrodes connected to form a radio frequency amplifier having a collector-to-emitter current path, a plurality of transistor intermediate frequency amplifiers, a transistor keyed automatic gain control circuit for controlling the bias on said transistor radio frequency amplifier, the improvement comprising:

means for developing a voltage that is proportional to the collector-to-emitter direct current of said radio frequency amplifier transistor;

low impedance biasing means connected to at least one of said intermediate frequency amplifier transistor to provide a voltage source for biasing said intermediate frequency amplifier transistor, said low impedance biasing means exhibiting an impedance that is low compared to the input impedance of said intermediate frequency amplifier transistor;

high impedance means coupling the voltage developed by said first means to said low impedance biasing means for said intermediate frequency amplifier transistor, and impedance means for applying the voltage developed by said first means to said keyed automatic gain control circuit transistor for increasing the gain of said keyed automatic gain control circuit.

14. An automatic gain control system for television receivers comprising:

a keyed automatic gain control circuit including a transistor for developing a direct current voltage that is a function of the strength of received video signals;

a transistor having base, emitter and collector electrodes;

circuit means connecting said base, emitter and collector electrodes to form a radio frequency amplifier stage having a collector-to-emitter current path and having an input circuit coupled to a source of received signals, said radio frequency amplifier stage exhibiting a gain versus transistor collector current characteristic that has a first portion wherein the radio frequency gain is substantially constant for a first range of collector currents and a second portion wherein the radio frequency gain decreases for collector currents greater than said first range;

means for biasing said radio frequency transistor in said first portion of said gain versus transistor collector current characteristic;

means for coupling said output of said automatic gain control circuit to said radio frequency amplifier transistor so that an increase in the strength of the received signal causes said transistor collector current to increase;

a plurality of intermediate frequency amplifier stages, each of said intermediate amplifier stages including a transistor, each of said intermediate amplifier stages exhibiting a gain versus transistor collector current characteristic that exhibits a decrease in gain for a range of decreasing transistor collector currents;

means for biasing each of said plurality of intermediate amplifier stage transistors in said range of transistor collector currents;

circuit means connected in series with the emitter-to-collector current path of said radio frequency amplifier transistor to develop a voltage that is a function of the collector-to-emitter current of said radio frequency amplifier transistor;

means for applying the voltage developed by said circuit means to said biasing means of at least one intermediate frequency amplifier transistor so that an increase in voltage developed across said circuit means causes a decrease in the intermediate frequency amplifier transistor collector current; and said biasing means for said radio frequency amplifier transistor and said biasing means for said intermediate frequency amplified transistor being so proportioned that for a first range of received signal levels the gain of the intermediate frequency amplifier stage is changed while the gain of said radio frequency amplifier stage remains substantially constant and for a second range of higher received signal levels the gain of both the radio frequency amplifier stage and the intermediate frequency amplifier stage is changed.

15. An automatic gain control system for television receivers comprising:

a keyed automatic gain control circuit, including a transistor, for developing a direct current voltage that is a function of the strength of the received signals;

a transistor having base, emitter and collector electrodes;

circuit means connecting said base, emitter and collector electrodes to form a radio frequency amplifier stage having a collector-to-emitter current path and having an input circuit coupled to a source of received signals, said radio frequency amplifier stage exhibiting a gain versus transistor collector current characteristic that has a first portion wherein the radio frequency amplifier stage gain is substantially constant for a first range of collector current and a second portion wherein the radio frequency amplifier stage gain decreases for collector currents greater than said first range;

means for biasing said radio frequency transistor in said first portion of said gain versus transistor collector current characteristic;

means for coupling said output of said automatic gain control circuit to said radio frequency amplifier stage transistor so that an increase in strength of the received signal causes said transistor collector current to increase;

a plurality of intermediate frequency amplifier stages, each of said intermediate amplifier stages including a transistor, each of said intermediate frequency amplifier stages exhibiting a gain versus current characteristic that exhibits a decrease in gain for a range of decreasing transistor collector currents;

means for biasing each of said plurality of intermediate frequency amplifier stage transistors in said range of collector currents;

circuit means connected in series with the emitter-to-collector current path of said radio frequency amplifier stage transistor to develop a voltage that is a function of the collector-to-emitter current of said radio frequency amplifier transistor;

means for applying the voltage developed by said circuit means to said biasing means of at least one intermediate frequency amplifier transistor so that an increase in voltage developed by said circuit means causes a decrease in the intermediate frequency amplifier transistor collector current;

said biasing means for said radio frequency amplifier stage transistor and said biasing means for said intermediate frequency amplifier stage transistor being so proportioned that for a first range of weak received signals the gain of the intermediate frequency amplifier stage is decreased while the gain of said radio frequency amplifier stage remains substantially constant, and for a second range of higher level received signals both the radio frequency amplifier stage gain and the intermediate frequency amplifier stage gain is decreased, and positive feedback means for applying the voltage developed across said circuit means to said keyed automatic gain control circuit transistor for increasing the efficiency of said automatic gain control circuit.

16. An automatic gain control system for television receivers comprising:

a keyed automatic gain control circuit, including a transistor, for developing a direct current voltage that is a function of the strength of received video signals;

a transistor having base, emitter and collector electrodes;

first circuit means connecting said base, emitter and collector electrodes to form a radio frequency amplifier stage having a collector-to-emitter current path and having an input circuit coupled to a source of received signals, said radio frequency amplifier stage exhibiting a gain versus transistor collector current characteristic that has a first portion wherein the radio frequency amplifier stage gain is substantially constant for a first range of collector current and a second portion wherein the radio frequency amplifier stage gain decreases for collector currents greater than said first range;

first biasing means for biasing said radio frequency amplifier stage transistor in said first portion of said gain versus transistor collector current characteristic;

means for coupling said output of said automatic gain control circuit to said radio frequency amplifier stage transistor so that an increase in the strength of the received signals causes said transistor collector current to increase;

a plurality of intermediate frequency amplifier stages, each of said intermediate frequency amplifier stages including a transistor, each of said intermediate frequency amplifier stages exhibiting a gain versus transistor collector current characteristic that exhibits a decrease in gain for a range of decreasing collector currents;

second biasing means for biasing each of said plurality of intermediate amplifier stage transistors in said range of transistor collector currents;

second circuit means connected in series with the collector-to-emitter current path of said radio frequency amplifier stage transistor to develop a voltage that is a function of the collector-to-emitter current of said radio frequency amplifier transistor;

means for applying the voltage developed by said second circuit means to said biasing means of at least one intermediate frequency amplifier stage transistor so that an increase in voltage developed by said circuit means causes a decrease in the intermediate frequency amplifier stage transistor collector current;

said first biasing means and said second biasing means being so proportioned that for a first range of low level received signals, the gain of the intermediate frequency amplifier stage is changed while the gain of said radio frequency amplifier stage remains substantially constant and for a second range of higher level received signals both the radio frequency amplifier stage gain and the intermediate frequency amplifier stage gain is changed;

positive feedback means coupling the voltage developed across said second circuit means to said keyed automatic gain control circuit transistor for increasing the efficiency of said automatic gain control circuit, and clamping means connected to said second circuit means for limiting the voltage developed across said second circuit means so that for a third range of high level received signals the gain of the radio frequency amplifier stage is decreased while the gain of the intermediate frequency amplifier stage remains substantially constant.

References Cited

UNITED STATES PATENTS

| | | | |
|---|---|---|---|
| 2,520,012 | 8/1950 | Montgomery | 325—410 XR |
| 3,084,216 | 4/1963 | Tschannen | 325—405 XR |
| 3,192,316 | 6/1965 | Humphrey | 325—405 XR |
| 3,205,444 | 9/1965 | Birkenes | 325—405 XR |
| 3,341,780 | 9/1967 | Sethna | 325—410 XR |

KATHLEEN H. CLAFFY, *Primary Examiner.*

R. LINN, *Assistant Examiner.*